(12) United States Patent
Fletcher et al.

(10) Patent No.: US 7,052,927 B1
(45) Date of Patent: May 30, 2006

(54) PIN DETECTOR APPARATUS AND METHOD OF FABRICATION

(75) Inventors: Christopher Lee Fletcher, Santa Barbara, CA (US); Andrew G. Toth, Oxnard, CA (US); Jerry R. Cripe, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/765,388

(22) Filed: Jan. 27, 2004

(51) Int. Cl.
*H01L 21/00* (2006.01)

(52) U.S. Cl. .......................... 438/57; 438/48; 438/455; 438/459; 438/974

(58) Field of Classification Search .............. 438/48, 438/57, 455, 459, 974
See application file for complete search history.

(56) References Cited

U.S. PATENT DOCUMENTS

| | | | |
|---|---|---|---|
| 4,782,028 A | 11/1988 | Farrier et al. .................. | 437/3 |
| 5,137,837 A | 8/1992 | Chang et al. .................. | 437/21 |
| 5,807,771 A | 9/1998 | Vu et al. ........................ | 438/154 |
| 6,072,224 A | 6/2000 | Tyson et al. .................. | 257/443 |
| 6,417,089 B1* | 7/2002 | Kim et al. ..................... | 438/612 |
| 6,617,646 B1 | 9/2003 | Parab ............................. | 257/347 |
| 6,812,527 B1* | 11/2004 | Dennard et al. ............. | 257/347 |

OTHER PUBLICATIONS

F. Foulon, L.Rousseau, L.Babadjian, S.Spirkovitch, A.Brambilla and P.Bergonzo, "A New Technique for the Fabrication of Thin Silicon Radiation Detectors", pp. 218-220, IEEE Transactions on Nuclear Science, vol. 46, No. 3, Jun. 1999.

* cited by examiner

*Primary Examiner*—Long Pham
(74) *Attorney, Agent, or Firm*—William C. Schubert; Karl A. Vick

(57) ABSTRACT

A PIN detector device (190) is fabricated on a substrate (10). The substrate (10) includes a handle wafer portion (208), an implanted oxide layer (206), a backside contact layer (204) and an active wafer portion (202). The substrate (10) serves as a foundation to increase stability and facilitate handling during fabrication of electrical circuitry (248) on a surface of the active wafer portion (202). After the electrical circuitry fabrication processing is substantially complete, the handle wafer portion (208) and implanted oxide layer (206) are removed to expose the implanted backside contact layer (204).

11 Claims, 19 Drawing Sheets

PIN DETECTOR APPARATUS AND METHOD OF FABRICATION

TECHNICAL FIELD

The present invention relates generally to a method of fabricating PIN (p-type/intrinsic/n-type) detectors and the apparatus produced from the method. More particularly, the present invention relates to a PIN detector that is produced on a substrate having a particular thickness and at a predetermined point during the fabrication process, removing selected portions of the substrate.

BACKGROUND

Conventional thin silicon PIN detectors are typically fabricated from a bulk wafer, i.e., a wafer having a thickness dimension between approximately 150–200 microns. On a front surface of the wafer, detectors are fabricated using semiconductor lithographic and thinfilm techniques. The backside of the wafer is implanted to form the second field plate of the detector. These wafers are then diced and hybridized onto individual readout integrated circuits (ROICs). A wirebond contact is made to the implanted field plate or detector common.

Prior attempts to process thin PIN detectors include, for example, processing the PIN detector as a thick wafer, for example 150–200 microns, and then mechanically thinning and implanting components at the detector level.

One conventional semiconductor device of silicon-on-insulator (SOI) complementary metal-oxide semiconductor (CMOS) is disclosed in U.S. Pat. No. 5,137,837, entitled, "Radiation-Hard, High-Voltage Semiconductive Device Structure Fabricated on SOI Substrate", issued Aug. 11, 1992 to Chen-Chi P. Chang et al. This semiconductor device includes highly-doped buried n-type and p-type wells in a first silicon layer, which covers an insulator, and over which a second silicon layer is formed with congruent lightly-doped n-type and p-type layers in which complementary MOSFET active devices are formed. While the semiconductor device formed by this process has many advantages, one drawback is that two separate silicon formation steps are required.

Another conventional CMOS device is disclosed in U.S. Pat. No. 5,807,771, entitled, "Radiation-Hard, Low Power, Submicron CMOS on a SOI Substrate", issued Sep. 15, 1998 to Truc Q. Vu et al. This patent relates to a radiation-hard, low-power semiconductor device of the CMOS type that is fabricated with a sub-micron feature size on a silicon-on-insulator (SOI) substrate. The SOI substrate may be of several different types.

Yet another conventional detector device is disclosed in U.S. Pat. No. 4,782,028, entitled, "Process Methodology for Two-Sided Fabrication of Devices on Thinned Silicon" issued Nov. 1, 1998 to Michael G. Farrier et al. This patent relates to a method for forming a detector device, such as a thinned bulk silicon blocked impurity transducer infrared detector, by thinning a semiconductor substrate and processing the thinned region on two sides to form the detector device. The semiconductor substrate is thinned to form a cavity in the substrate. Further processing on both sides of the thinned region is performed while the thinned region is still connected to the thicker substrate. The thinned region is then separated from the substrate upon completion of the processing steps. The device is then mounted to a readout device.

SUMMARY

The present invention provides advances in the state of the art by providing an improved PIN detector and method for manufacturing the improved PIN detector. This improved PIN detector and method of fabrication is accomplished by using a substrate, having a full or standard thickness. A field plate is implanted or embedded in an active wafer layer, which is typically between approximately 5 and 200 microns. A contact to the field plate is achieved, such as through a chemically selective, isotropic, or RIE (reactive ion etching) etch that intersects the field plate implant at the buried etch stop. After the detector is hybridized, a portion of the substrate, referred to as the handle portion, can be removed or detached such as with wafer grinding, chemical mechanical polish, a silicon etch (e.g., TMAH or KOH), or a combination of all the above to the BOX (buried oxide). Then the BOX is removed (e.g., via a buffer oxide etchant (BOE) or a dilute HF solution) leaving a thinned PIN that is typically between approximately 5 and 200 microns thick. Preferably, the entire handle portion and the entire wafer portion are removed. Most preferably, the entire handle portion is removed in one process step. As used herein, one process step includes multiple repetitions of the same process type. For example, removing a portion of a layer by fast etching with a concentrated etchant followed by removing a separate portion of the same layer by slow etching with a dilute etchant constitutes a single process step of removal by etching.

Accordingly, one embodiment of the present invention is directed to a PIN apparatus that includes a wafer portion, electrical circuitry disposed on a first surface of the wafer portion and a bonding portion disposed on a second surface of the wafer portion. The wafer portion and the bonding portion are portions of a substrate. The substrate is formed by conventional wafer bonding techniques for bonding the wafer portion to a handle portion of the substrate, and disposing an oxide portion therebetween.

A further embodiment of the present invention is directed to the PIN apparatus described above wherein the thickness of the wafer portion is a function of a minimum thickness of the apparatus.

Another embodiment of the present invention is directed to a method of fabricating a PIN radiation detector device. In the method, a substrate is provided that has an intrinsic active layer, a handle layer, a contact layer that has a first electrical conductivity (e.g., n or p-type) disposed between the active and the handle layers, and a buried oxide layer disposed between the contact layer and the handle layer. A portion of the active layer is then removed to expose a first surface of the conductive contact layer. A material having a second electrical conductivity type (e.g., p or n-type) is introduced within the active layer at a detector site, such that the material is separated from the contact layer by at least a portion of the intrinsic active layer. A first electrically conductive terminal is formed to electrically couple with the contact layer at the first surface, and a second electrically conductive terminal is formed to electrically couple with the introduced material.

Another embodiment is a method of fabricating an array of p-intrinsic-n detector devices. In this method, an opening is made through an intrinsic active layer of a substrate to expose a first surface of an embedded contact plate. The contact plate has a first electrical conductivity type. The substrate further includes a handle layer disposed such that the contact plate is disposed between the handle layer and the active layer. A material is introduced into the intrinsic active layer, at each of a plurality of detector sites, such that at least a portion of the active layer lies between the material and the contact layer at each detector site. The material has a second electrical conductivity type. At least one first conductive terminal is formed that is electrically coupled to the first surface of the contact plate. Also, a plurality of second conductive terminals are formed. Individual ones of these second terminals are electrically coupled to the material at individual ones of the detector sites. The wafer is then hybridized to a read out integrated circuit through the conductive bumps. After hybridizing, at least a part of the handle layer is removed to expose a second surface of the contact layer that faces opposite the active layer, where the second surface is a radiation receiving surface.

Yet another embodiment of the present invention is directed to a computer operating system stored on a computer-readable medium for directing a computer to execute a method that includes forming electrical circuitry on a wafer portion of a substrate. The substrate having a handle portion, an oxide material portion, a bonding material portion and the wafer portion. The entire handle portion and the oxide material portion are removed to expose at least part of the bonding material portion.

Yet another embodiment of the present invention is directed to the computer operating system stored on a computer-readable medium described above that further includes establishing a location on the substrate for the removing step to occur.

BRIEF DESCRIPTION OF THE DRAWINGS

Various advantages of the present invention will become apparent to those skilled in the art by reading the following specification and by reference to the drawings in which.

DETAILED DESCRIPTION OF THE PREFERRED EMBODIMENTS

The present invention provides advances in the state of the art by providing an improved method for manufacturing PIN detectors. This improved PIN detector and method of fabrication is accomplished by using a substrate, having a full or standard thickness. A field plate is implanted or embedded in the active wafer layer, which is typically between approximately 5 and 200 microns thick. A contact to the field plate is achieved through a chemically selective, isotropic, RIE (reactive ion etch) or DRIE (deep reactive ion etch) silicon etch that intersects the field plate implant at the buried etch stop. After the detector is hybridized, a portion of the substrate, referred to as the handle portion, can be removed or detached with wafer backside grinding, chemical mechanical polishing, silicon etch (e.g., TMAH or KOH), or combination to the BOX (buried oxide) portion. Then the BOX portion is removed (e.g., BOE) leaving a thinned PIN that is typically between approximately 5 and 200 microns thick. Preferably, the thickness of the thinned PIN is less than 100 microns, and most preferably is less than 50 microns. An advantage to the present invention is that the device may be handled as a full thickness substrate and detector chip until the handle wafer portion and etch stop and/or bonding layer are removed. Removal reveals a completed device that has an integrated and reliable field plate connection.

Another advantage of the present invention is that it eliminates a traditional wirebond connection to the detector common field plate over the thin silicon PIN detectors.

As will be seen by reading the following text, the present invention results in a more cost effective detector since material costs are reduced. Furthermore, labor costs are reduced since the labor associated with the processing is reduced, particularly thinning of the detector. Furthermore, since the substrate is relatively thick and robust during most of the fabrication process, wafer breakage is substantially reduced. Also the detectors produced by the present method are easier to handle since the substrate portion provides a substantial backing material. Higher output volumes are possible since field plate implantation occurs at the wafer-level. Quality and reliability are improved since the integrated field plate connection is eliminated following the hybridization wirebond. The total thickness variation (TTV) in the detector layer is precisely controlled and not substantially affected by flatness of the ROIC, hybridization results, or the thinning process. Furthermore, thicker substrates permit hybridization of larger FPAs.

Figure 1:
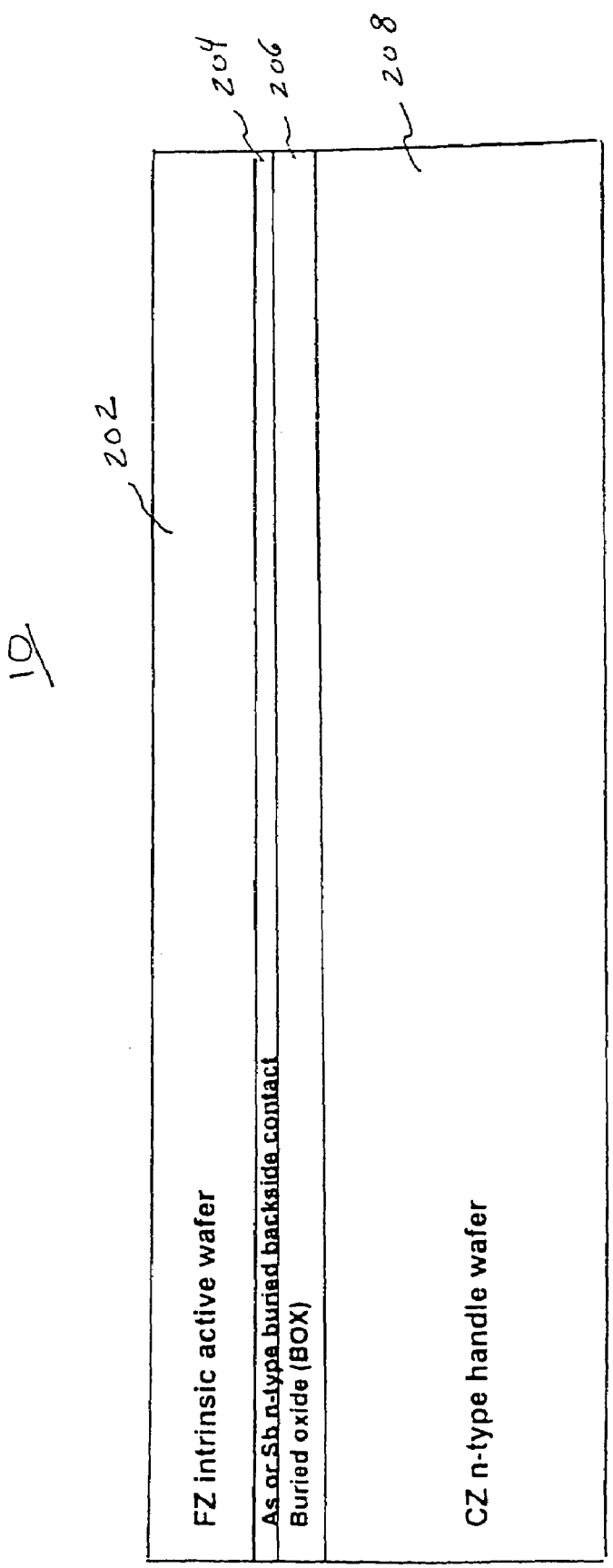
FIGS. 1–19 are cross-sectional views of the detector device during various steps in the fabrication process.

FIG. 1 shows a cross-sectional view of a substrate 10 that includes: a handle wafer portion 208, which may be an n-type material such as formed by a Czochralski process (CZ) or a magnetic field applied CZ process (MCZ); a buried oxide layer 206; a buried backside contact portion 204; and an active wafer portion 202. The buried backside contact portion 204 may, for example, comprise arsenic or antimony or phosphorous or other suitable n-type material and may be approximately between 0.01 and 5 microns thick. The intrinsic active wafer portion 202 may be between approximately 5 and 200 microns thick and may be formed by a float zone growth method process (FZ). As used herein the term portion means a separate part or any fraction of the whole, including the entire whole.

Figure 2:
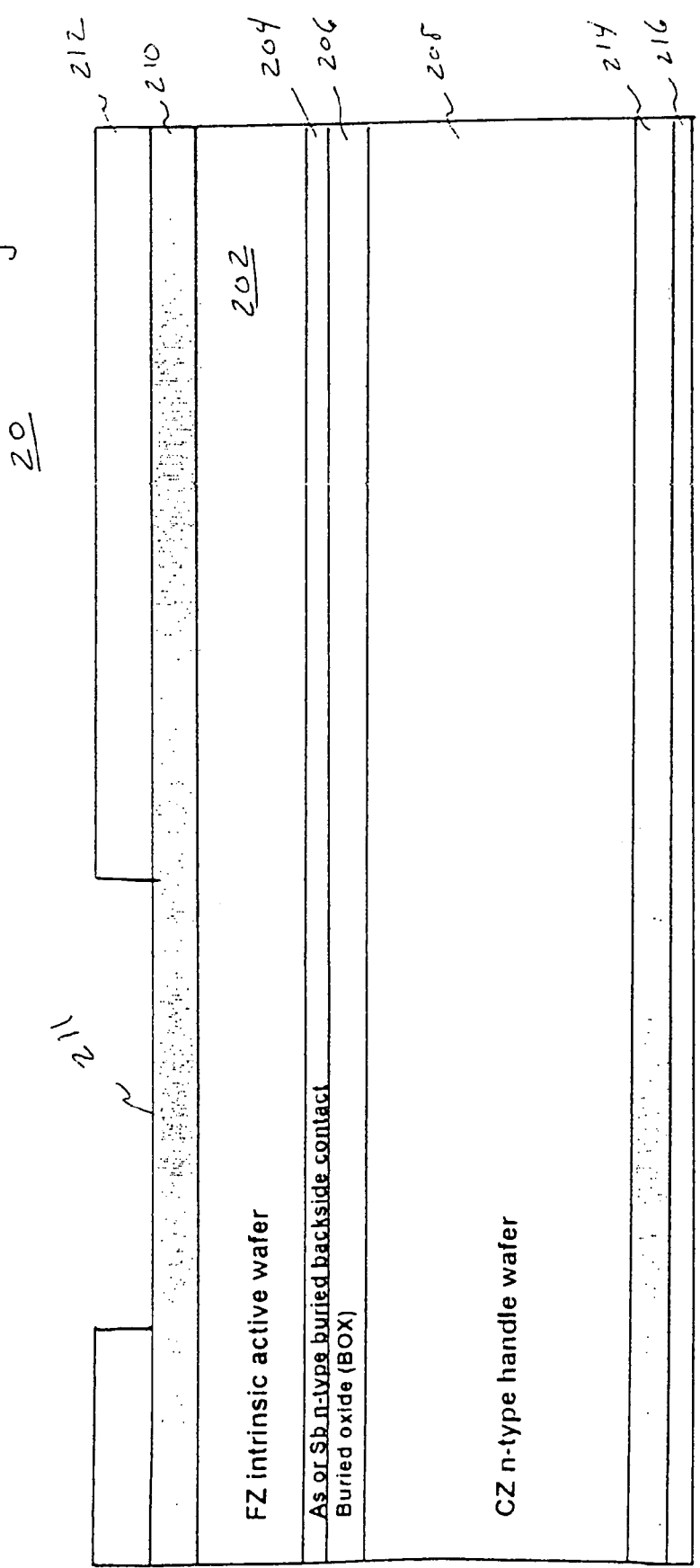

FIG. 2 shows a cross-sectional view of substrate 20 that also has oxide layers and photoresist layers. Substrate 20 is similar to substrate 10 described above (i.e., handle wafer portion 208, buried oxide layer portion 206, buried backside contact portion 204, and active wafer portion 202) and further includes oxidation layers 210 and 214 and photoresist layers 212 and 216.

Oxidation layer 214 is formed on a lower surface of handle wafer portion 208 and oxidation layer 210 is formed on an upper surface of active wafer portion 202. Each oxidation layer 210, 214 is preferably between approximately 2500 Angstroms and 6000 Angstroms thick, nominally between approximately 2900 Angstroms and 3600 Angstroms. The oxide thickness depends on the thickness of layer 202. The oxidation layers 210 and 214 typically comprise $SiO_2$ (silicon dioxide, also referred to as silicon oxide herein) which may be formed, for example, from a wet oxidation process at 925 degrees Celsius.

Layers 212 and 216 comprise photoresist material, and each layer 212, 216 has a nominal thickness of approximately 1.6 micrometers. Photoresist layer 212 is formed on oxidized layer 210 and photoresist layer 216 is formed on oxidized layer 214. The photoresist material 212 is developed to expose the silicon dioxide that will be removed to allow the substrate 202 to be exposed etch at region 211.

Figure 3:
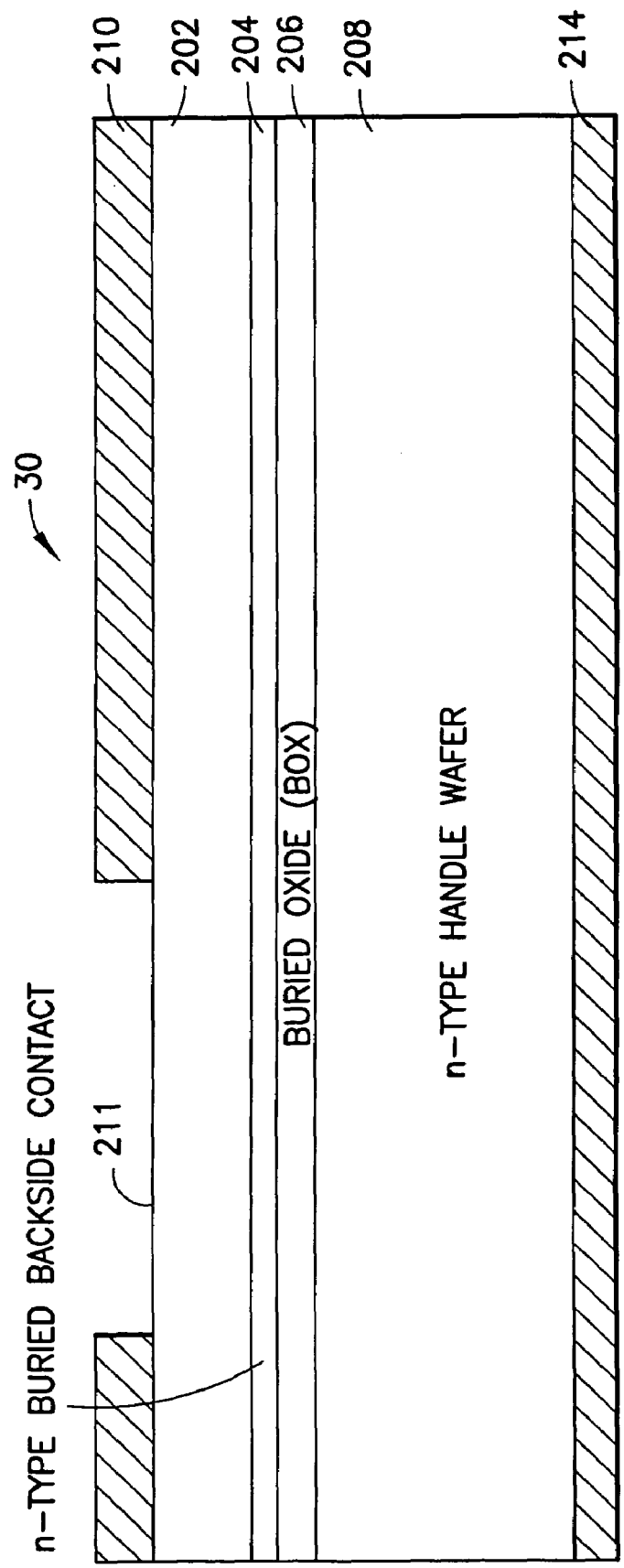

FIG. 3 shows a substrate 30, which is similar to substrate 20 except that substrate 30 shows that photoresist layers 212 and 216, shown in FIG. 2, have been stripped. A BOE etch may be used to etch the oxide layer 210, at region 211, such that oxide layer 210 has a nominal target thickness of approximately 3200 Angstroms. Region 211 also illustrates that the oxide layer 210 has been etched to expose a section of active wafer portion 202. Oxide layer 214 is typically not etched. The elements described in relation to FIGS. 1 and 2 are not discussed in relation to FIG. 3 (i.e., handle wafer portion 208, buried oxide layer portion 206, buried backside contact portion 204, and active wafer portion 202).

Figure 4:
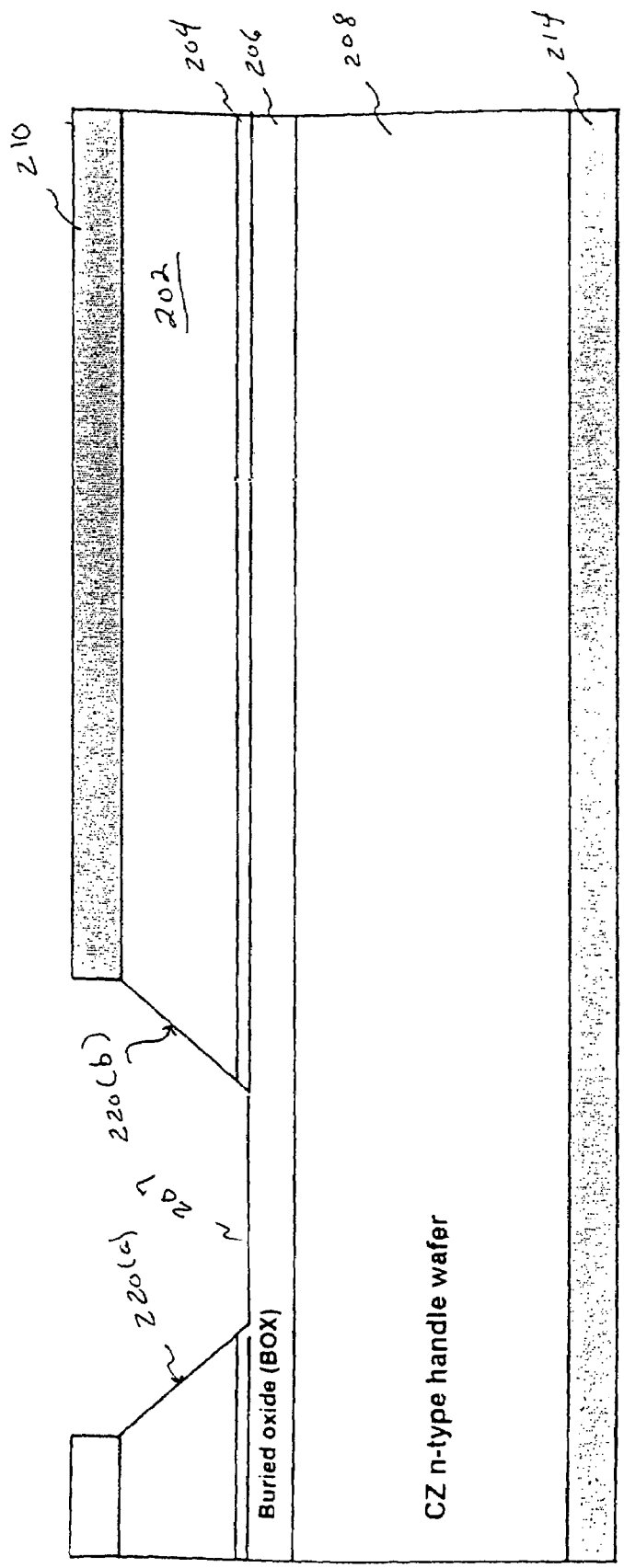

FIG. 4 shows device 40, which results from further processing substrate 30 shown in FIG. 3. (The term device is used to define the substrate 10, which has additional processing performed on it.) Device 40 shows that active wafer portion 202 is etched to expose a portion 207 of the buried oxide layer 206. A region of the buried backside contact portion 204 is etched. One etching compound that may be used is, for example, a KOH (potassium hydroxide) anisotropic etch or plasma oxide etch; however, any suitable etching substance could be used. Surfaces 220(a) and 220(b) are formed, as shown in FIG. 4. The other elements have been described previously and are not discussed in relation to FIG. 4.

Figure 5:
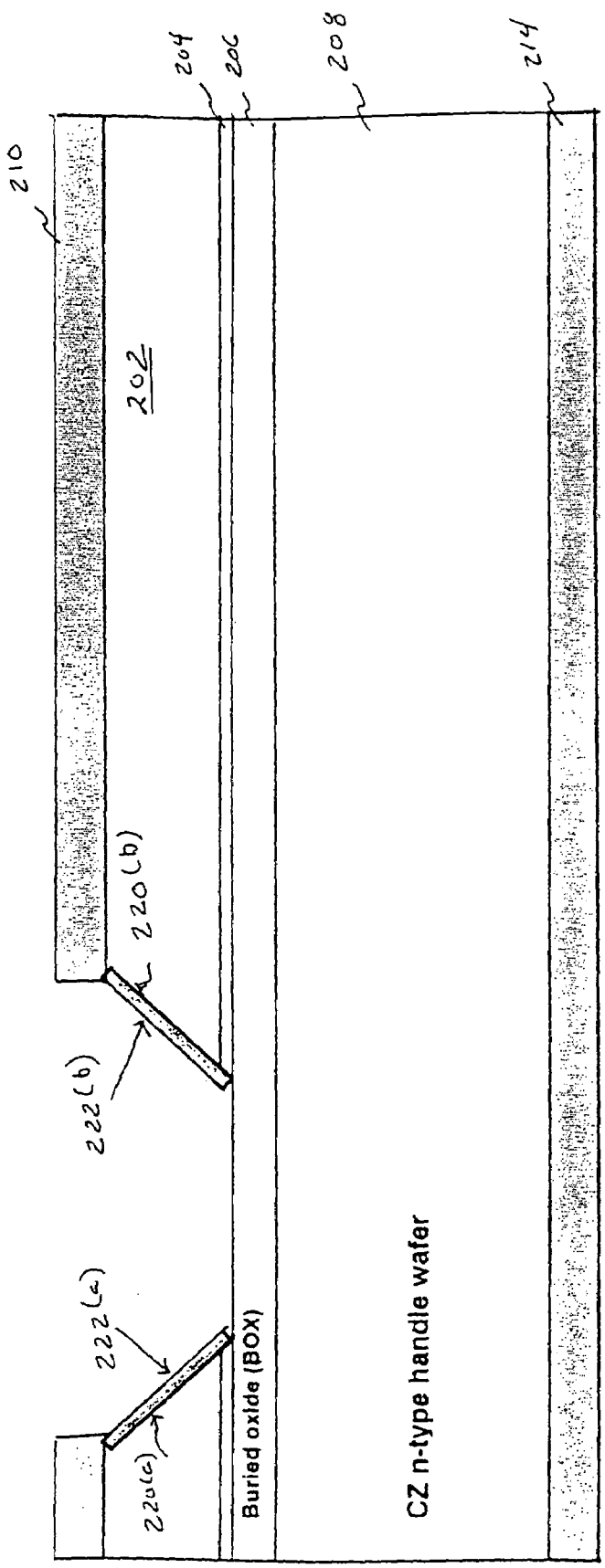

FIG. 5 shows device 50, which results from further processing device 40 shown in FIG. 4. Device 50 shows that surfaces 220(a) and 220(b), which were formed from etching active wafer portion 202 and buried backside contact portion 204, are implanted to form layers 222(a) and 222(b). These layers are typically formed using ion implantation of As in a concentration sufficient to make electrical contact to layer 204, the buried backside contact. The other elements have been described previously and are not discussed in relation to FIG. 5.

Figure 6:
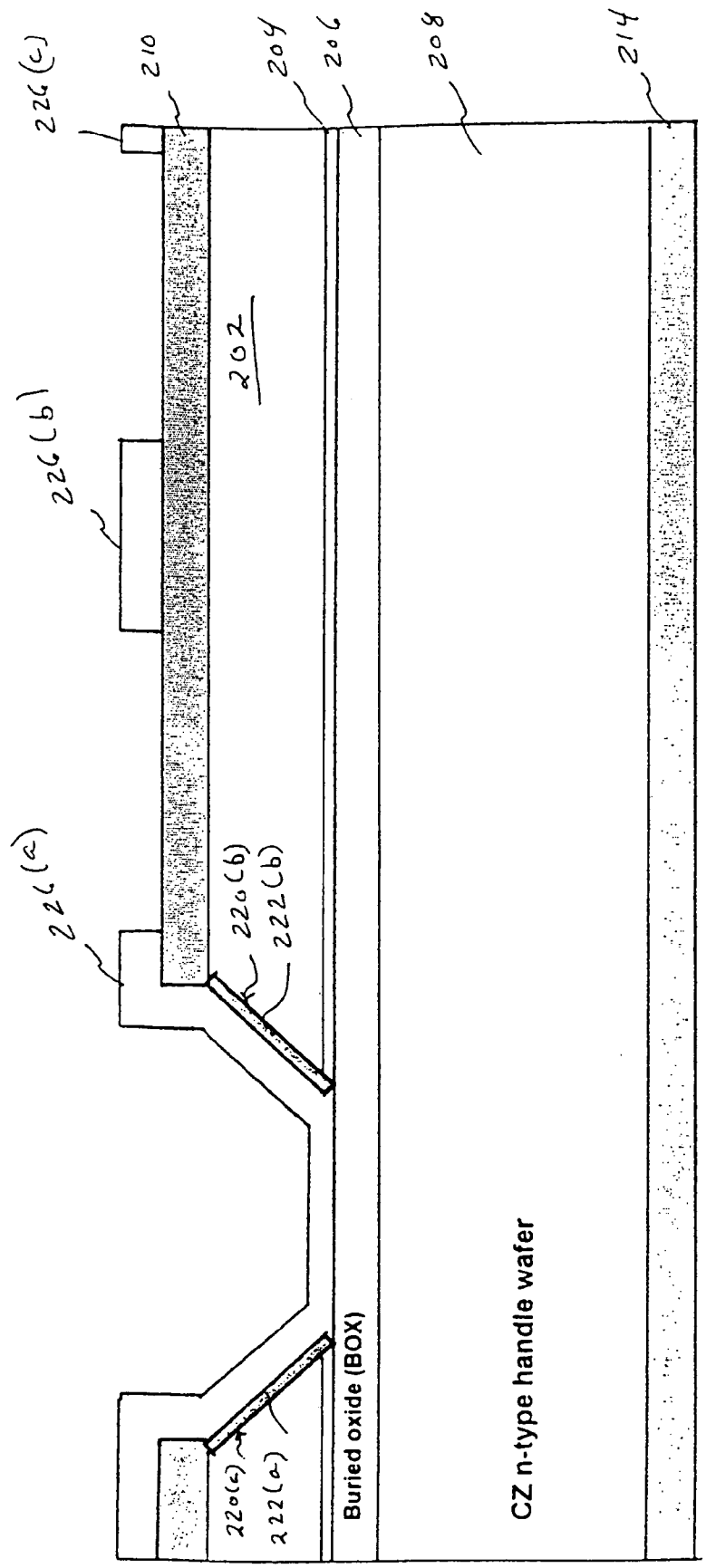

FIG. 6 shows device 60, which results from further processing device 50 shown in FIG. 5. Device 60 shows that a photoresist material is applied on surface 210 and layer 222(a) and 222(b) and exposed region of buried oxide layer 206. The photoresist material is stripped to expose the individual detectors of an array, leaving photoresist portion 226(a) on a portion of oxide layer 210, layers 222(a) and 222(b) and exposed region of buried oxide layer 206. Photoresist portions 226(b) and 226(c) remain on another portion of oxide layer 210. The other elements have been described previously and are not discussed in relation to FIG. 6.

Figure 7:
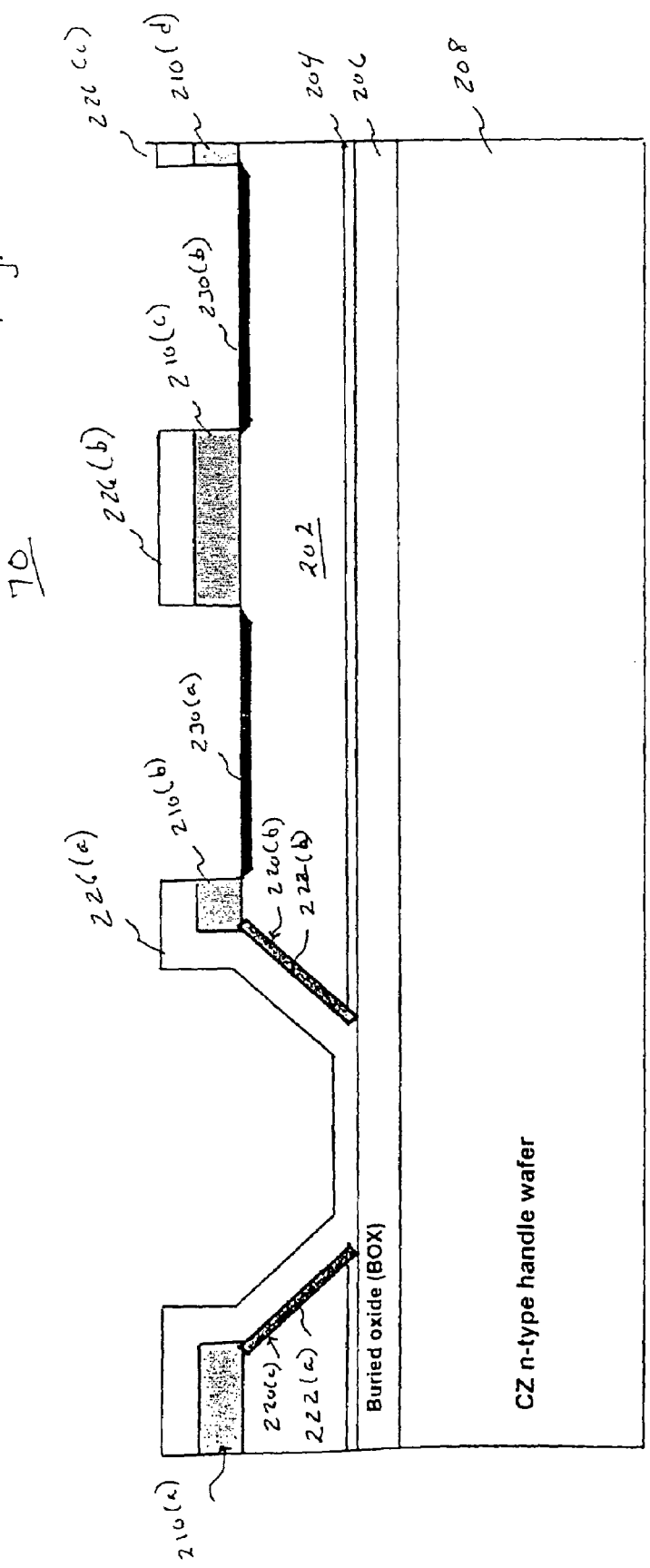

FIG. 7 shows device 70, which results from further processing device 60 shown in FIG. 6. Device 70 shows that oxide layer 210 is etched to form oxide portions 210(a), 210(b), 210(c) and 210(d). Detector areas 230(a) and 230(b), for example to be used as diode detectors, are exposed on the active wafer portion 202. The etching process may be accomplished using a suitable etching compound to remove desired portions so as to form detector areas 230(a) and 230(b). One example is to implant boron to form the detector at sites 230(a) and 230(b). While boron has been used as one example, other P-type dopant materials such as aluminum or gallium may also be used.

As shown in FIG. 7, oxidation layer 214 has been removed from the lower surface of handle wafer portion 208 during the same etch used to expose the detector areas 230(a) and 230(b). The other elements have been described previously and are not discussed in relation to FIG. 7.

Figure 8:
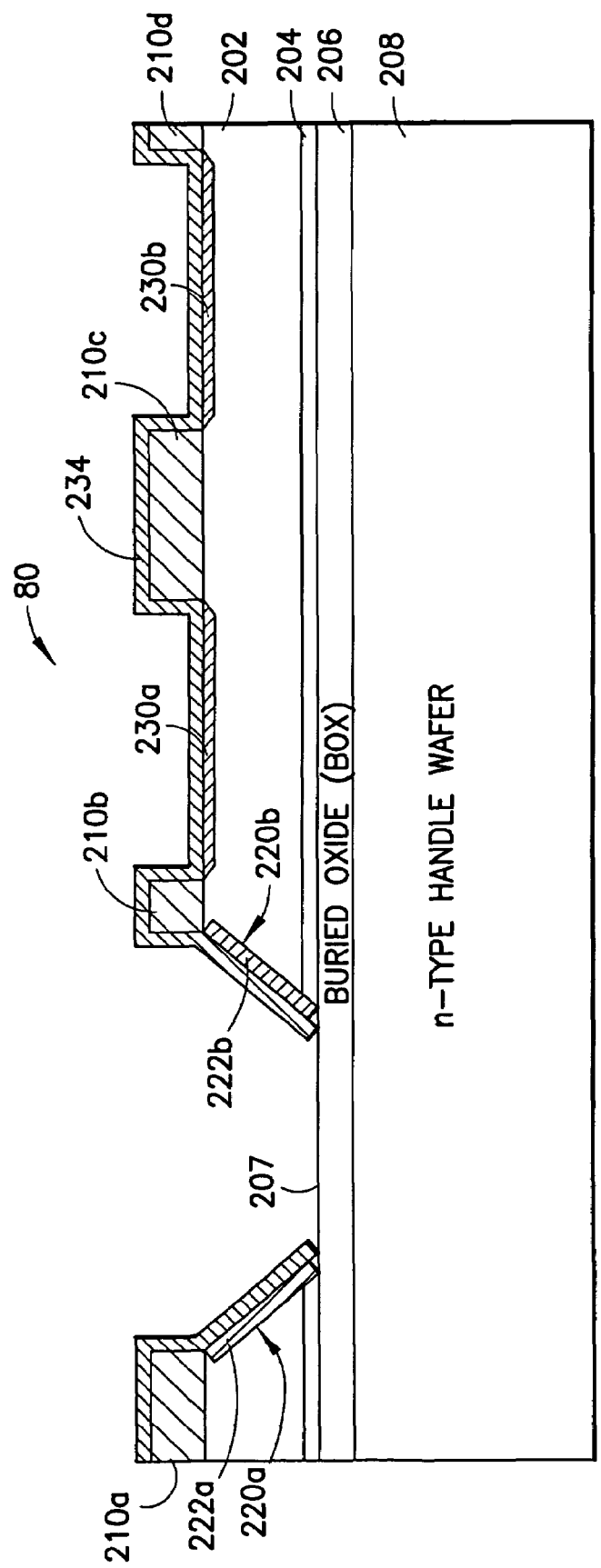

FIG. 8 shows device 80, which results from further processing device 70 shown in FIG. 7. Device 80 shows that photoresist portions 226(a)–(c) are stripped using a suitable stripping compound. An oxide layer 234 is grown on the upper surface of oxide portions 210(a)–(d), implanted surfaces 222(a) and 222(b) and detector areas 230(a) and 230(b). Oxide layer 234 is preferably approximately between 350 Angstroms and 650 Angstroms thick and more preferably approximately 500 Angstroms thick. Oxide layer 234 may be grown, for example, at approximately 1000 degrees Celsius and may be silicon dioxide ($SiO_2$) or other suitable material that exhibits similar characteristics. The oxide layer 234 may also serve as activation anneal for the implanted arsenic and/or boron materials noted above.

As shown in FIG. 8, the oxide layer 234 is not grown on the exposed portion 207 of buried oxide layer 206. The other elements have been described previously and are not discussed in relation to FIG. 8.

Figure 9:
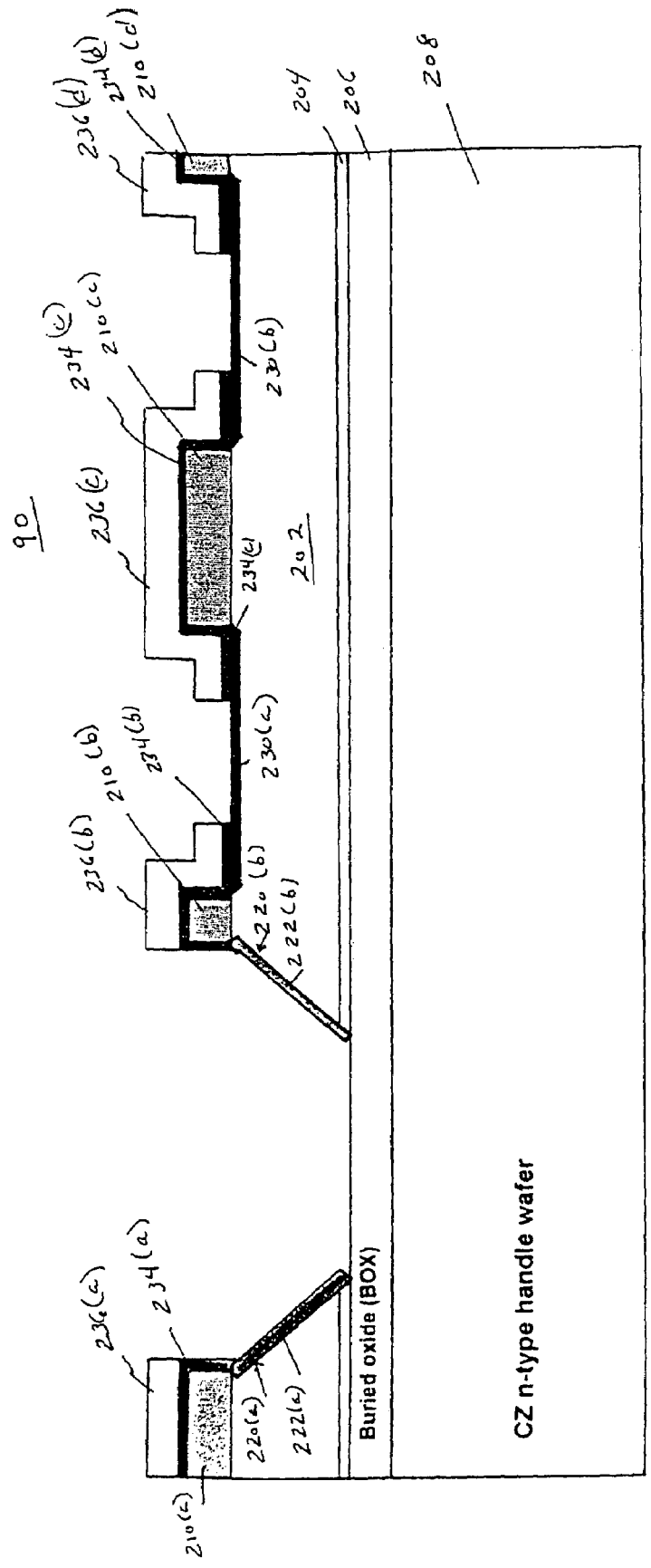

FIG. 9 shows device 90, which results from further processing device 80 shown in FIG. 8. Device 90 shows that a photoresist layer is applied and selectively stripped to form photoresist areas 236(a)–(d) on corresponding portions of the oxide layer 234(a)–(d), respectively. Photoresist layer (generally 236) is, for example, a detector contact implant photoresist.

Also, as shown in FIG. 9, portions of the oxide layer 234 have been etched to expose, for example, the surfaces 222(a) and 222(b) and selected portions of the detector areas 230(a) and 230(b). This step patterns contact openings for the backside contact portion 204 and the detector areas 230(a) and 230(b). The other elements have been described previously and are not discussed in relation to FIG. 9.

Figure 10:
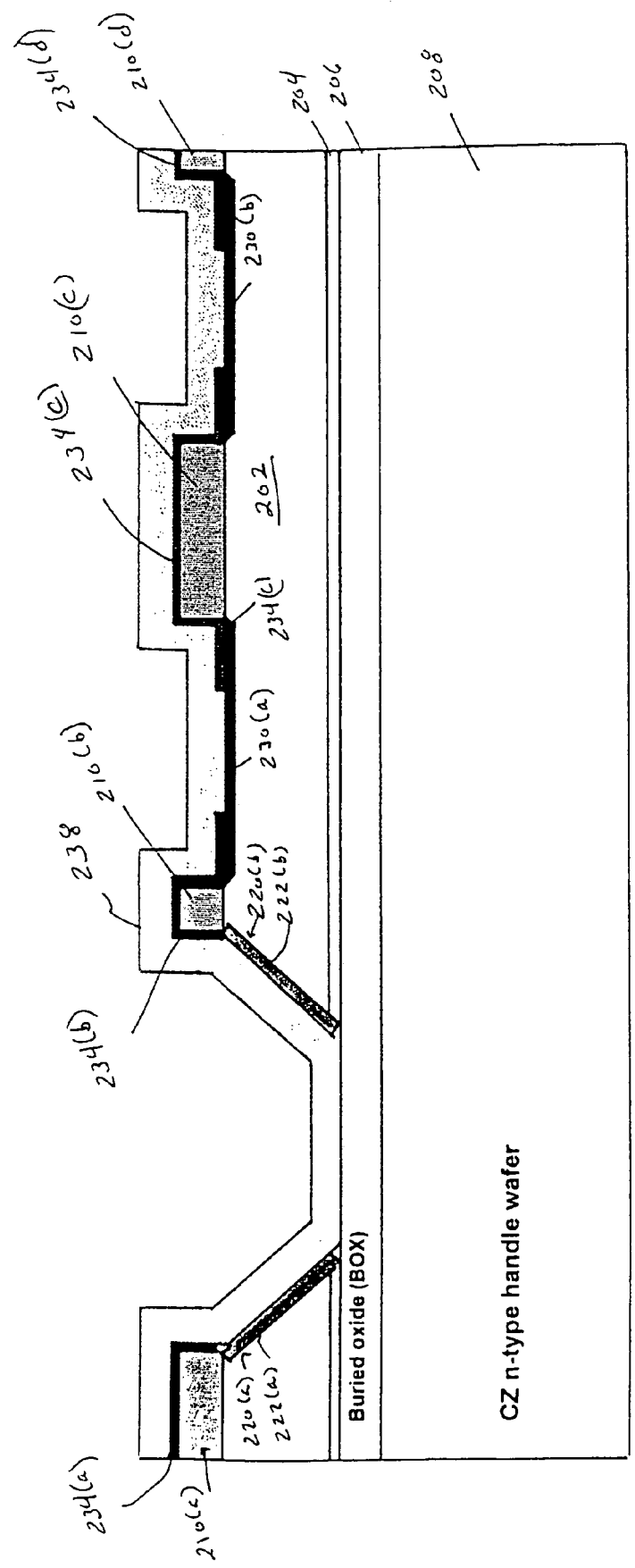

FIG. 10 shows device 100, which results from further processing device 90 shown in FIG. 9. Device 100 shows that the photoresist portions 236(a)–(d) are stripped and a conductive layer 238 is applied to the oxide layer portions 234(a)–(d) and surfaces 222(a) and 222(b) and detector areas 230(a) and 230(b). Conductive layer 238 is, for example, a metal, such as aluminum, copper, silver, platinum, or other electrically conductive material. Layer 238 may be applied, for example, using a sputtering technique, or other suitable deposition technique, and typically results in a deposition layer between approximately 3500 Angstroms and 6500 Angstroms thick and preferably approximately 5000 Angstroms thick. The other elements have been described previously and are not discussed in relation to FIG. 10.

Figure 11:
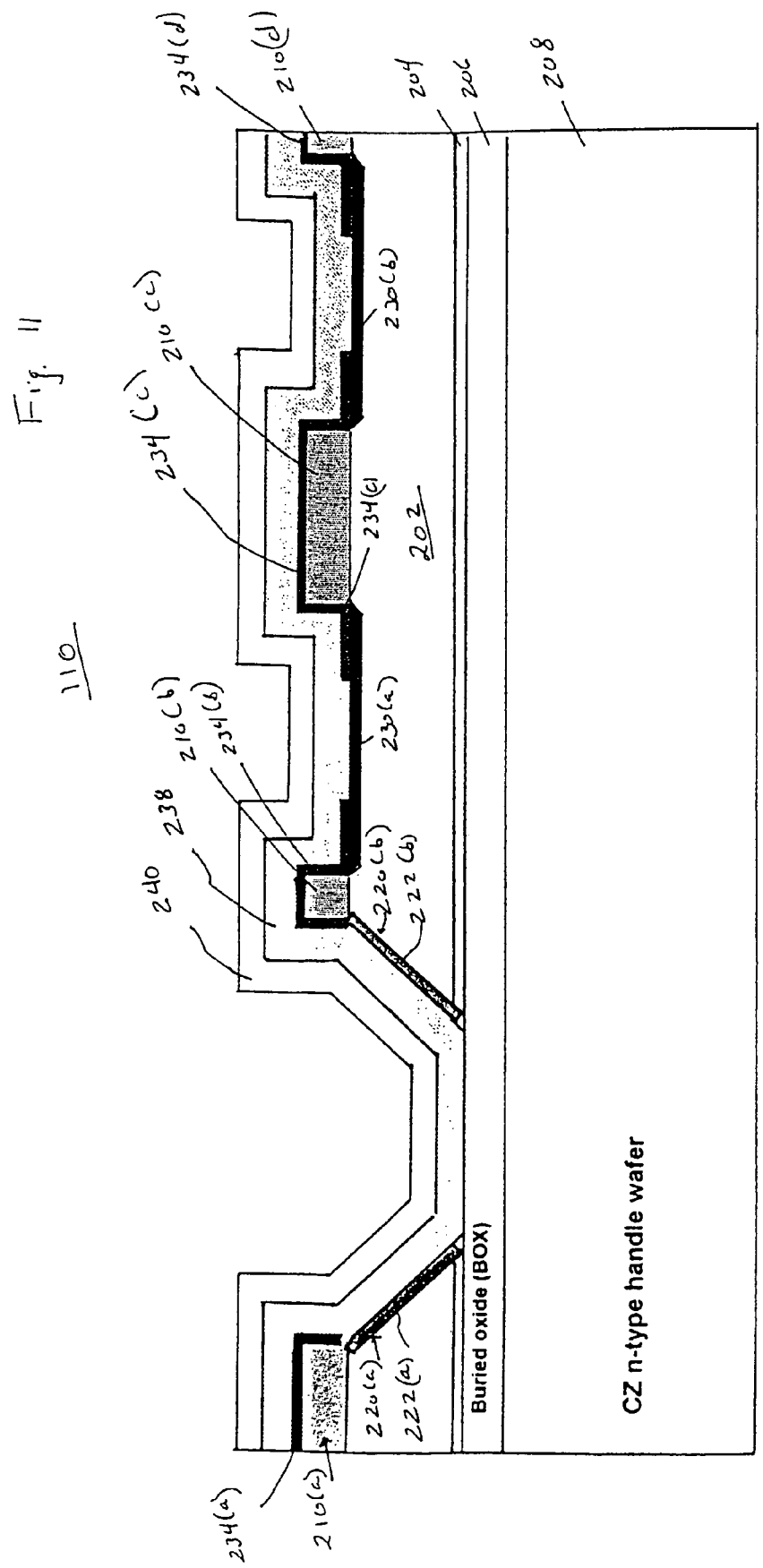

FIG. 11 shows device 110, which results from further processing device 100 shown in FIG. 10. Device 110 shows that a photoresist material 240 is applied on an upper surface of layer 238. The photoresist layer 240 is used for metal delineation. The other elements have been described previously and are not discussed in relation to FIG. 11.

Figure 12:
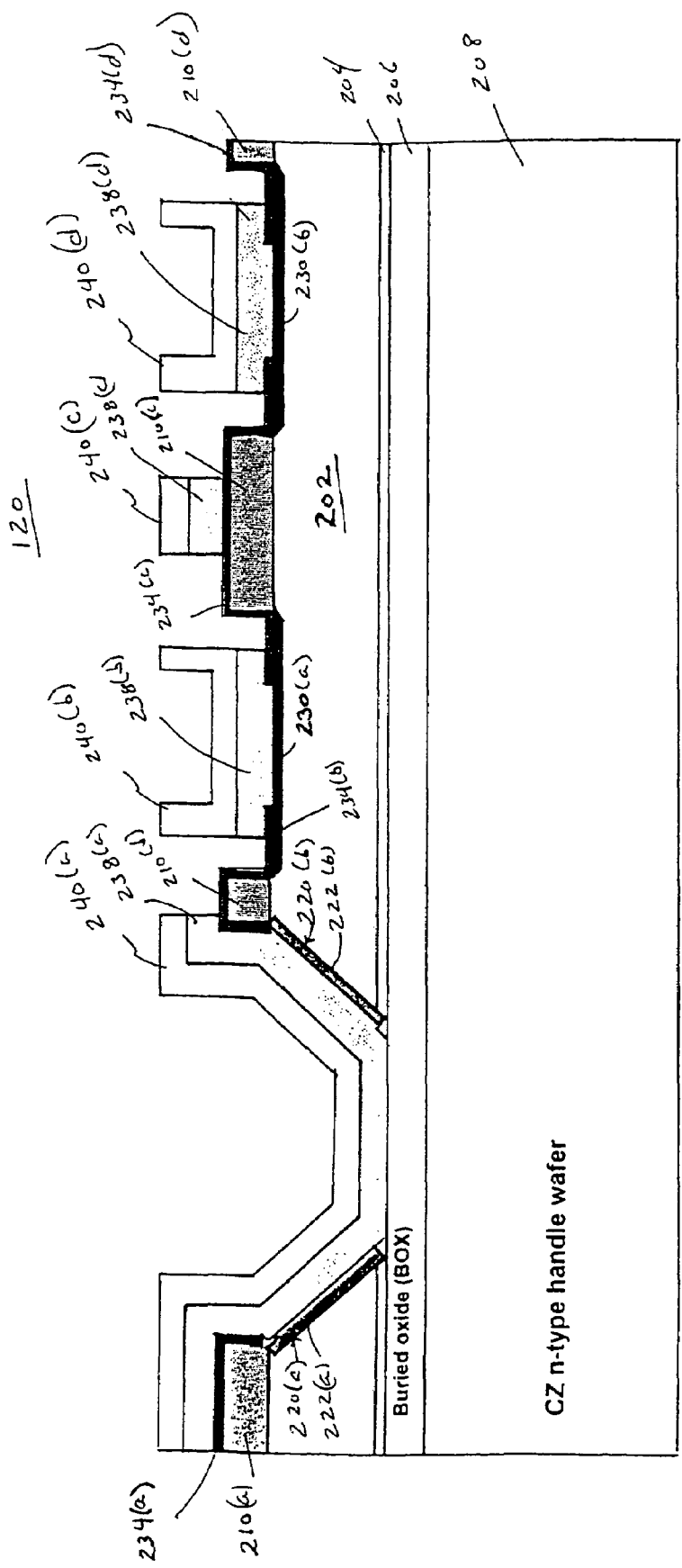

FIG. 12 shows device 120, which results from further processing device 110 shown in FIG. 11. Device 120 shows that selected portions of photoresist layer 240 are removed leaving portions 240(a)–(d) and selected portions of conductive layer 238 are removed leaving portions 238(a)–(d). This processing step also exposes portions of oxide layer 234, i.e., 234(b), 234(c) and 234(d); however, other portions of oxide layer 234(b), 234(c) and 234(d) may not be entirely exposed. As shown in FIG. 12, some areas of layer 234 are covered by portions of layer 238 and 240. Any wet or dry aluminum etch technique can generally be used. Additionally, the field plate 204 can be used to control the surface and prevent inversion between the detector areas 230(a) and 230(b) by imposing additional mask and etch steps similar to those above, preferably with an additional ion implantation into the substrate 202. These additional steps may alternatively be performed after formation of the devices but prior to removal of the handle wafer portion 208, followed by annealing with a laser or other heat-focused device.

Figure 13:
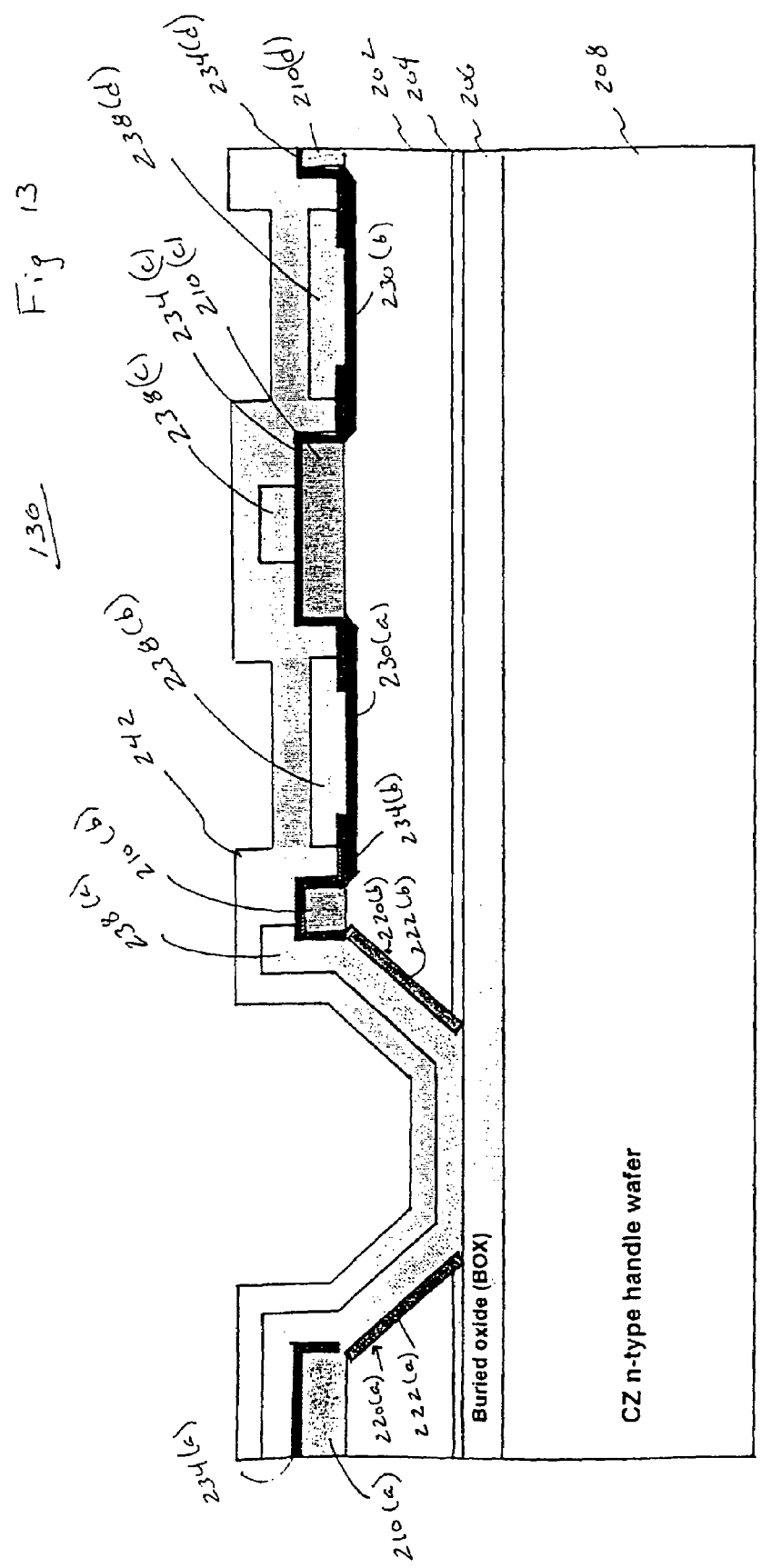

FIG. 13 shows device 130, which results from further processing device 120 shown in FIG. 12. Device 130 shows that photoresist layer 240 has been removed, using a stripping compound, and an oxide layer 242 is applied. Oxide layer 242 is typically, for example, a silicon-based oxide, such as silicon oxide, and applied by a suitable deposition technique at between approximately 400 and 450 degrees Celsius. Oxide layer 242 is applied to cover conductive layer portions 238(a)–(d) and oxide layer portions 234(b)–(d). The other elements have been described previously and are not further discussed in relation to FIG. 13.

Figure 14:
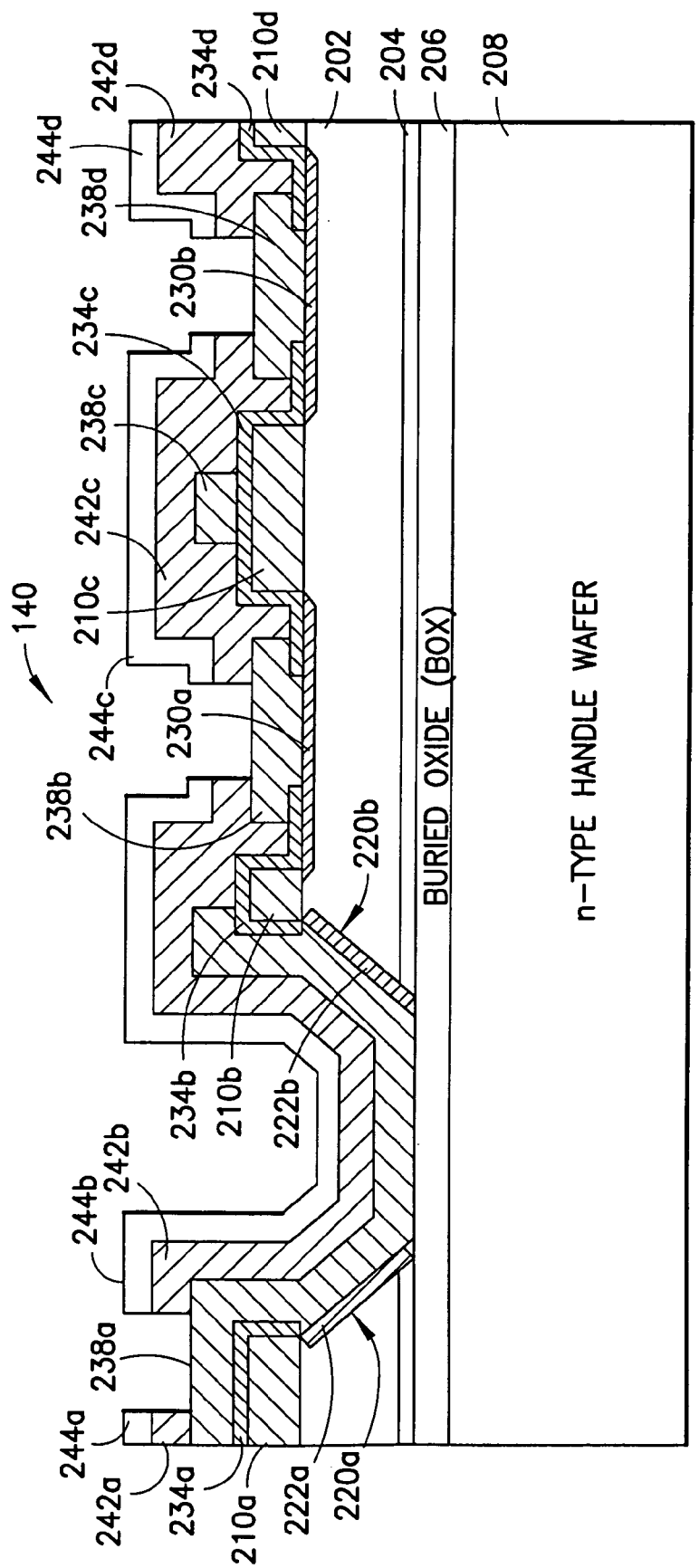

FIG. 14 shows device 140, which results from further processing device 130 shown in FIG. 13. FIG. 14 shows that contacts, on device 140, to active device elements 230(a), 230(b), 222(a) and 222(b) are exposed for electrical interconnect, such as indium bump contacts. This may be accomplished by applying a photoresist material 244, and selectively etching the oxide layer 242 and selectively stripping the photoresist material 244 to form bump contact portions 244(a)–(d) on corresponding oxide layer portions 242(a)–(d), respectively. The etching also exposes conductive layer portions 238(a), 238(b) and 238(d). The other elements have been described previously and are not further discussed in relation to FIG. 14.

Figure 15:
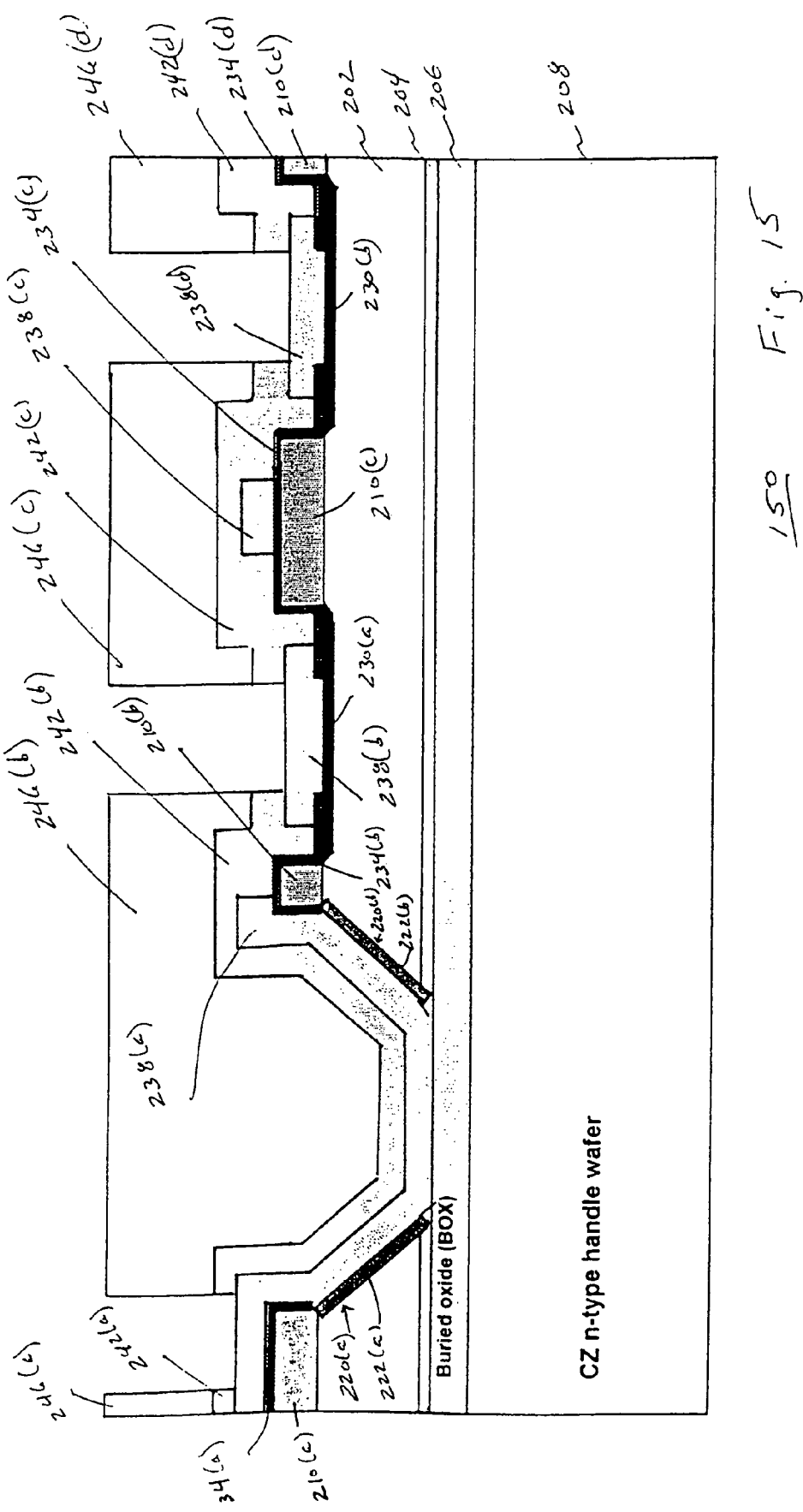

FIG. 15 shows device 150, which results from further processing device 140 shown in FIG. 14. Device 150 shows that photoresist material 244 is stripped and a double layer of bump photoresist material 246, such as indium, is applied to form the photoresist portions 246(a)–(d). The other elements have been described previously and are not discussed in relation to FIG. 15.

Figure 16:
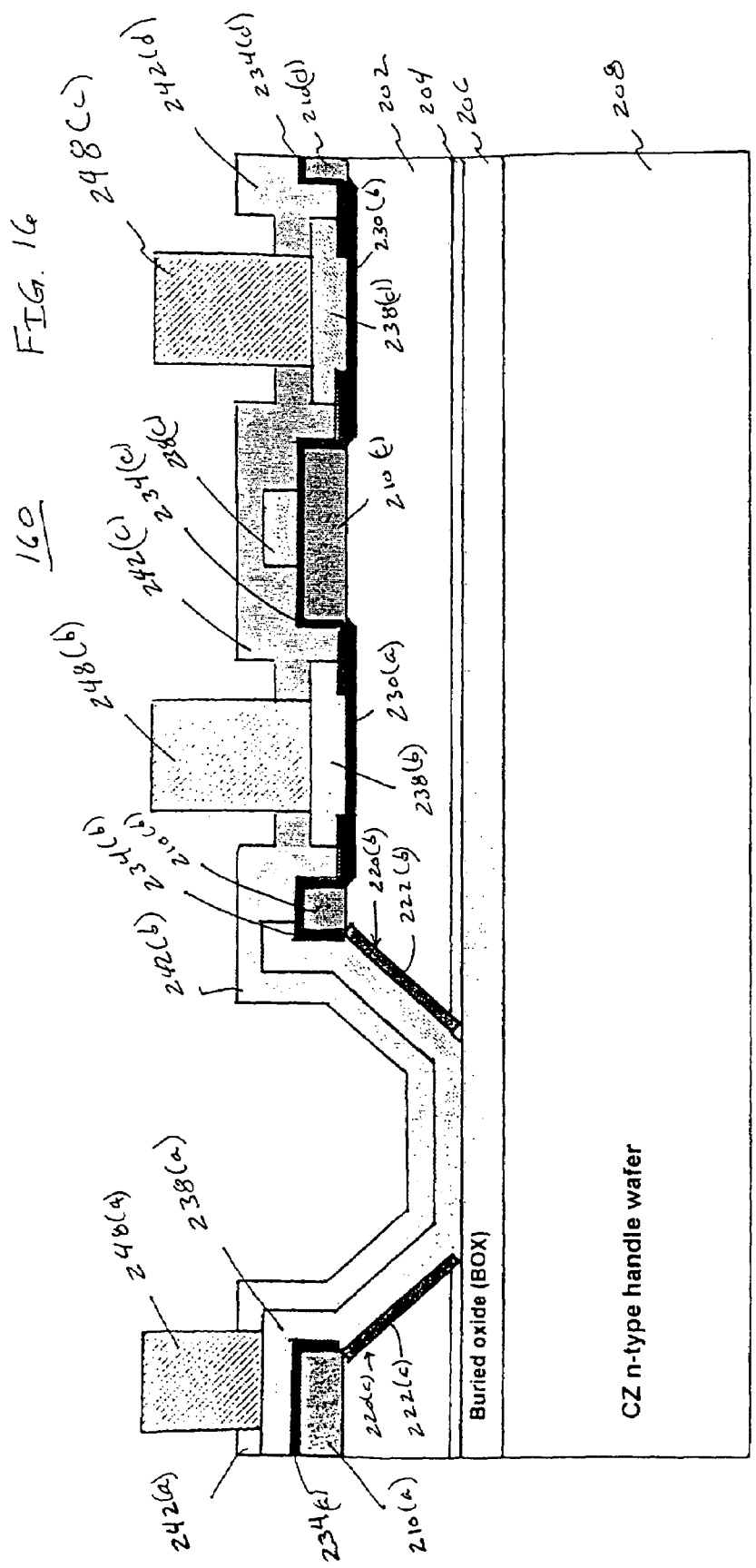

FIG. 16 shows device 160, which results from further processing device 150 shown in FIG. 15. Device 160 shows that the bump formations are achieved by depositing a bump metallization and then removing the bump photoresist material 246 to reveal bump formations 248(a)–(c). The formations 248(a)–(c) are in physical contact with corresponding portions of metal layer 238(a), 238(b) and 238(d). The other elements have been described previously and are not discussed in relation to FIG. 16.

Figure 17:
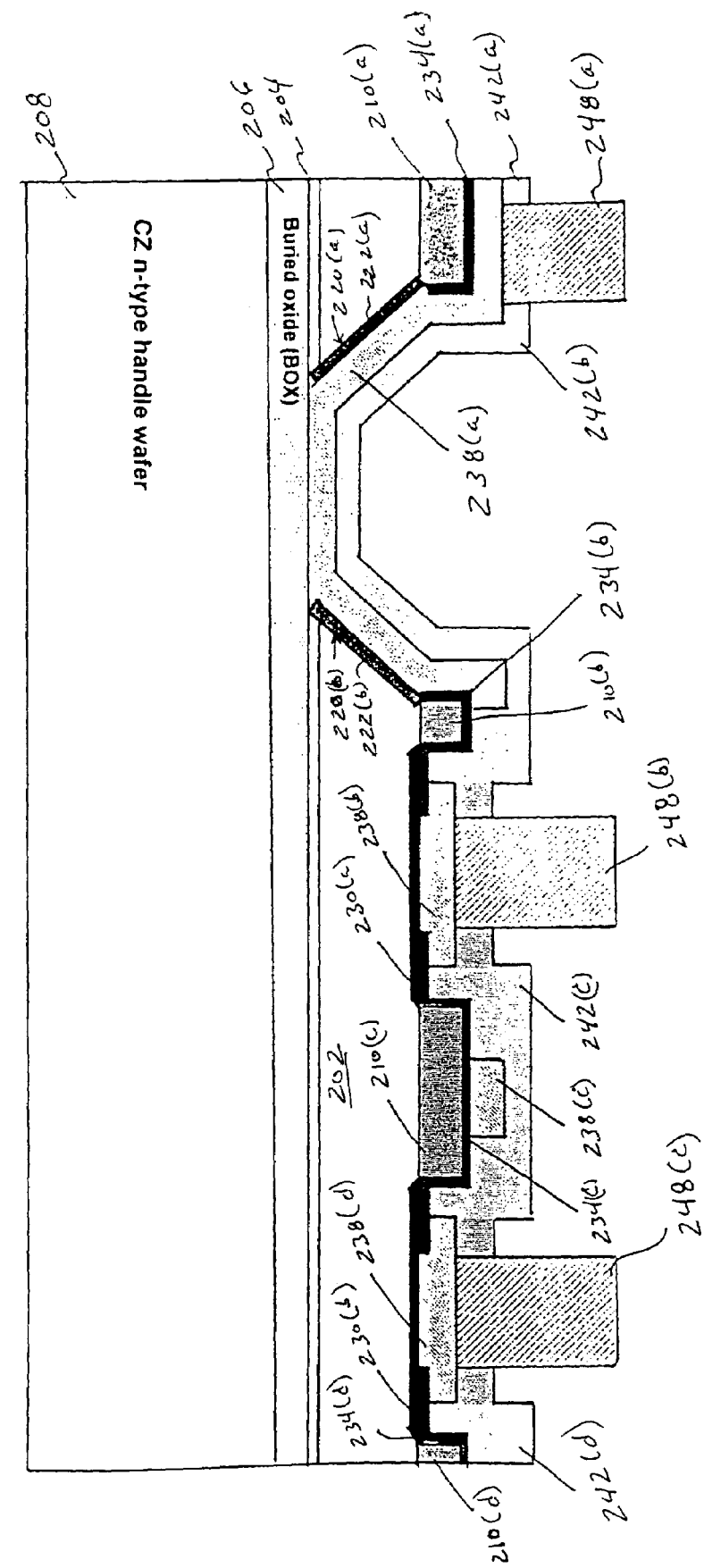

FIG. 17 shows device 170, which is an inverted device 160 shown in FIG. 16. Device 170 shows that the handle wafer portion 208 is positioned so that it may be removed without substantially affecting the relationship or integrity of the other components that are disposed on device 170.

Figure 18:
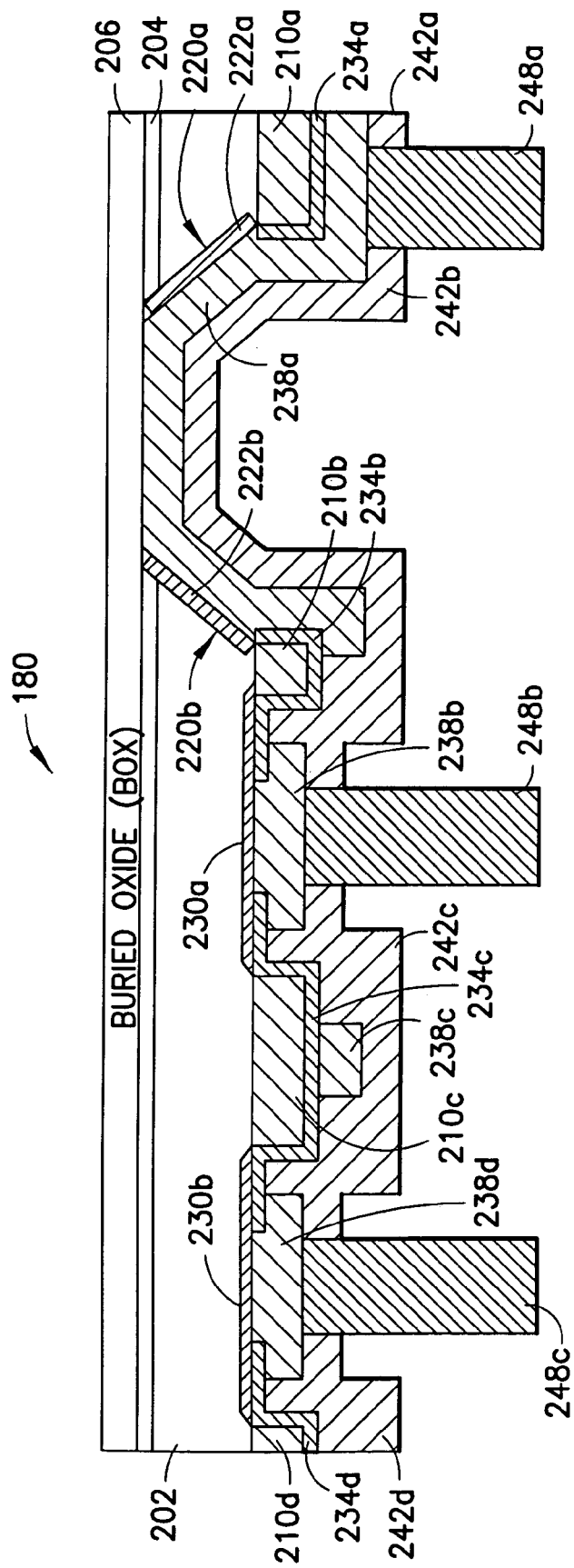

FIG. 18 shows device 180, which results from further processing device 170 shown in FIG. 17. Device 180 shows that the handle wafer portion (previously shown herein as element 208), which provided desirable stability and facilitated handling during the fabrication process, has been removed. Removal of the handle wafer portion may be achieved by silicon etch such as TMAH or KOH or WBG.

Figure 19:
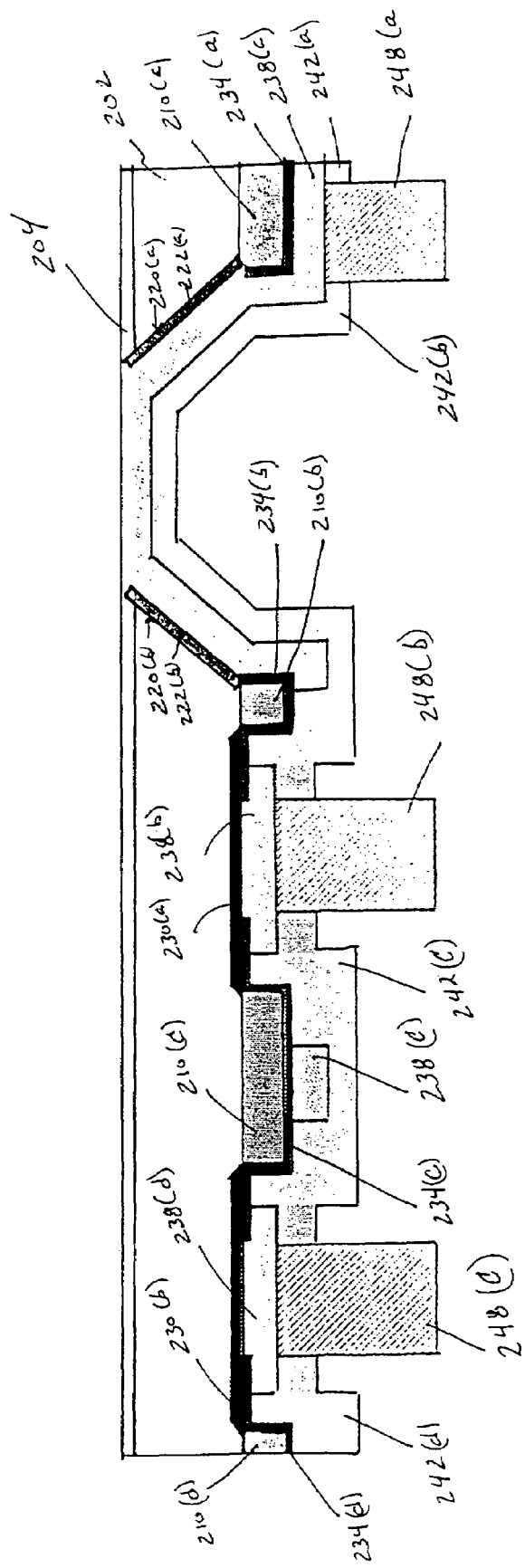

FIG. 19 shows device 190, which results from further processing device 180 shown in FIG. 18. Device 190 shows that the buried oxide layer (previously shown herein as element 206) has been removed to expose backside contact portion 204. During silicon etches used to fabricate the devices on the active wafer portion 202, the silicon etch may form grooves that develop into holes through the active wafer portion and through the field plate 204. Upon removal of the BOX layer 206 as depicted in FIG. 19, some of those holes are then exposed. Generally, the device 190 is secured to a read out integrated circuit ROIC or other supporting substrate with an epoxy selected to prevent the BOE from attacking any metal or underlying circuitry within the device 190. The size of these holes may generally be controlled by the particulars of the etching process, which results in controlling the size of the etch grooves. The etch to remove the BOX layer 206 is preferably done in two process sub-steps as a combination of BOE and PAE etchant. PAE etchant does not attack the underlying metal, and may be used as a pad etch to expose metal contacts through the overglass or conformal coating.

FIG. 19 shows a cross-sectional view of an improved PIN device 190 fabricated according to the present invention. The device 190 has the advantage that a backside contact 204 and oxide portion (shown herein as element 206) are embedded between an active wafer portion 202 and a handle wafer portion (shown herein as element 208) to form the substrate (shown generally herein as element 10). Electrical circuitry is formed on an upper surface of the active wafer portion 202 and upon completion of the formation process, the handle wafer portion (shown herein as element 208) and buried oxide portion (shown herein as element 206) are removed to expose the contact portion 204. This fabrication process permits the handle wafer portion to provide enhanced stability during the fabrication process.

Thus, the description describes PIN detector fabrication on a substrate. The electrical circuitry is disposed, (i.e., mounted, fabricated) and when the disposition is substantially complete, such that additional processing can be satisfactorily performed on a thinned substrate (i.e., a substrate in which the handle portion and oxide portion have been removed), the handle portion and oxide portion are removed. The manner in which these portions are removed can either be multiple etching or detaching steps, or a single step to remove both the handle and the oxide portion.

The removal process for the handle portion is typically a function of the location of the oxide layer and similarly, the removal of the oxide layer is typically a function of the location of the contact layer. The contact layer may be positioned such that the removal of the handle and the oxide portions are based on a pre-determined quantity or, alternatively, the removal may be specific for each particular apparatus.

It is also an embodiment of the present invention that the fabrication and removal processes can be stored on an electronic medium, such as RAM (random access memory) ROM (read only memory) or other non-volatile memory (NVM). Thus a computer may be used to implement the present invention.

While the present invention has been described as a series of discrete steps, it is also an embodiment that one or more of the steps described herein could be combined to reduce the number of steps. Also, the disclosed sequence of steps is not critical and it is contemplated that one skilled in the art would be aware of modifications in the sequence of steps described herein. Combining steps and modifying the sequence of the steps described does not depart from the scope of the invention.

Furthermore, while the present invention has been described in terms of particular materials there are other materials, which may interchangeable, that should be understood by one skilled in the art to be equivalents. Indeed the present invention may be accomplished with any combination of materials that result in a similar result.

Furthermore, while specific dimensions have been provided to describe the invention, it is contemplated that one of ordinary skill in the art may modify the dimensions without departing from the invention.

What is claimed is:

1. A method of fabricating a PIN radiation detector device comprising:
providing a substrate comprising an intrinsic active layer, a handle layer, a contact layer having a first electrical conductivity type disposed between the active layer and the handle layer, and a buried oxide layer disposed between the contact layer and the handle layer;
removing a portion of the active layer to expose a first surface of the contact layer;

introducing a material having a second electrical conductivity type within the active layer at a detector site, said material separated from the contact layer by at least a portion of the intrinsic active layer; and forming a first electrically conductive terminal to electrically couple with the contact layer at the first surface and a second electrically conductive terminal to electrically couple with the said material.

2. The method of claim 1, wherein the detector site comprises a PIN diode detector coupled in common with other PIN diode detectors via said contact layer.

3. The method of claim 1, further comprising:
hybridizing the substrate via at least said first and second electrically conductive terminals; and
after hybridizing, removing at least a portion of the handle and buried oxide layers, thereby exposing at least a portion of a second surface of the contact layer, said second surface being a radiation receiving surface.

4. The method of claim 3, wherein the entire handle layer is removed in a single process step.

5. The method of claim 3, wherein hybridizing the substrate comprises hybridizing the substrate to a read out integrated circuit.

6. The method of claim 3 wherein removing at least a portion of the handle and buried oxide layers comprises etching to the buried oxide layer and separately removing at least a portion of the buried oxide layer.

7. The method of claim 1, wherein the first electrical conductivity type comprises n-type, and the second electrical conductivity type comprises p-type.

8. The method of claim 1, wherein providing a substrate comprises providing the handle layer with the buried oxide layer, bonding an n-type contact layer to the buried oxide layer, and disposing the intrinsic active wafer layer over the contact layer.

9. The method of claim 1, wherein the contact layer has a thickness between about 0.01 microns and about 5 microns.

10. A method of fabricating an array of p-intrinsic-n detector devices comprising:

making an opening through an intrinsic active layer of a substrate to expose a first surface of an embedded contact plate having a first electrical conductivity type, where the substrate further comprises a handle layer wherein the contact plate is disposed between the handle layer and the active layer;

introducing into the intrinsic active layer a material of a second electrical conductivity type at each of a plurality of detector sites such that at least a portion of the active layer lies between the material and the contact layer at each detector site;

forming at least one first conductive bump that is electrically coupled to the first surface of the contact plate;

forming a plurality of second conductive terminals, individual ones of which are electrically coupled to the material at an individual one of the plurality of detector sites;

hybridizing the substrate to a read out integrated circuit through the conductive bumps;

after hybridizing, removing at least some of the handle layer to expose a second surface of the contact layer facing opposite the active layer, said second surface being a radiation receiving surface.

11. The method of claim 10, wherein the first electrical conductivity type comprises n-type, and the second electrical conductivity type comprises p-type.

* * * * *